United States Patent
Chang et al.

(10) Patent No.: US 8,669,619 B2
(45) Date of Patent: Mar. 11, 2014

(54) SEMICONDUCTOR STRUCTURE WITH MULTI-LAYER CONTACT ETCH STOP LAYER STRUCTURE

(75) Inventors: Tien-Chang Chang, Hsinchu (TW); Jing-Hao Chen, Singapore (SG); Ming-Tzong Yang, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 97 days.

(21) Appl. No.: 12/940,022

(22) Filed: Nov. 4, 2010

(65) Prior Publication Data

US 2012/0112289 A1    May 10, 2012

(51) Int. Cl.
*H01L 27/092* (2006.01)
(52) U.S. Cl.
USPC  257/369; 257/292; 257/E21.24; 257/E31.001; 257/E21.001
(58) Field of Classification Search
USPC ............... 257/369, 292, E21.24, E31.001, 257/E21.001
See application file for complete search history.

(56) References Cited

U.S. PATENT DOCUMENTS

| 2003/0054670 A1* | 3/2003 | Wang et al. ............ 438/787 |
| 2007/0105292 A1 | 5/2007 | Chen |
| 2008/0138983 A1* | 6/2008 | Lien et al. ............ 438/680 |
| 2008/0258233 A1 | 10/2008 | Hsiao |
| 2009/0057735 A1* | 3/2009 | Beak et al. ............ 257/292 |
| 2010/0193876 A1* | 8/2010 | Ramani et al. ............ 257/377 |

FOREIGN PATENT DOCUMENTS

CN    101295733 A    10/2008

* cited by examiner

*Primary Examiner* — Marc Armand
(74) *Attorney, Agent, or Firm* — Winston Hsu; Scott Margo

(57) ABSTRACT

A semiconductor device structure includes a substrate having a transistor thereon; a multi-layer contact etching stop layer (CESL) structure covering the transistor, the multi-layer CESL structure comprising a first CESL and a second CESL; and a dielectric layer on the second CESL. The first CESL is made of a material different from that of the second CESL, and the second CESL is made of a material different from that of the dielectric layer.

18 Claims, 5 Drawing Sheets

SEMICONDUCTOR STRUCTURE WITH MULTI-LAYER CONTACT ETCH STOP LAYER STRUCTURE

BACKGROUND OF THE INVENTION

1. Field of the Invention

The present invention relates generally to the field of semiconductor fabrication and, more particularly, to an improved semiconductor device structure with multi-layer contact etch stop layer (CESL) structure for reducing charging damage to integrated circuits during semiconductor manufacturing.

2. Description of the Prior Art

As known in the art, plasma process induced damage is caused by the accumulation of charges collected by floating conductors which act like antennas during a plasma processes. Typically, damage to thin insulators such as gate oxide sandwiched between a conductive substrate and isolated conductive electrodes on the surface of a wafer (gates) occurs due to current flow through the insulator, driven by a potential difference between the surface electrode and the substrate. During wafer processing, wafer-scale potential differences are caused by global non-uniformities in plasma density and/or electron temperature.

For the thick oxide devices, as the gate oxide thickness is large, there is not much leakage current through tunneling. This enables buildup of the charge at the gate electrode, raising its potential and finally breaking down the oxide or dielectric stack. In some cases, it could be a "hard" breakdown which render the device useless, while some other times it can create latent defects in the gate oxide stack which limits the lifetime of the device.

Charging damage to integrated circuits during plasma processing of integrated circuit die in a semiconductor wafer may be reduced by processing scribe lines during wafer fabrication to facilitate the flow of current to and from the wafer substrate through the scribe lines during integrated circuit fabrication and reduce current flow through integrated circuit components. However, the aforesaid prior art method is still not satisfactory.

In light of the above, plasma process induced damage is costly in terms of wafer yield and reliability, and therefore there is a need in the semiconductor processing art to develop an improved semiconductor device structure which is capable of overcoming the shortcomings and deficiencies of the prior art.

SUMMARY OF THE INVENTION

To address these and other objects and in view of its purposes, the present invention provides a semiconductor device structure including a substrate having a transistor thereon; a multi-layer contact etching stop layer (CESL) structure covering the transistor, the multi-layer CESL structure comprising a first CESL and a second CESL; and a dielectric layer on the second CESL. The first CESL is made of a material different from that of the second CESL, and the second CESL is made of a material different from that of the dielectric layer.

According to another aspect of this invention, a semiconductor device structure includes a substrate comprising an N-type metal-oxide-semiconductor (NMOS) transistor and a P-type metal-oxide-semiconductor (PMOS) transistor thereon; a multi-layer contact etching stop layer (CESL) structure covering both of the NMOS transistor and the PMOS transistor, the multi-layer CESL structure comprising a first CESL and a second CESL; and a dielectric layer on the second CESL. The first CESL is made of a material different from that of the second CESL, and the second CESL is made of a material different from that of the dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
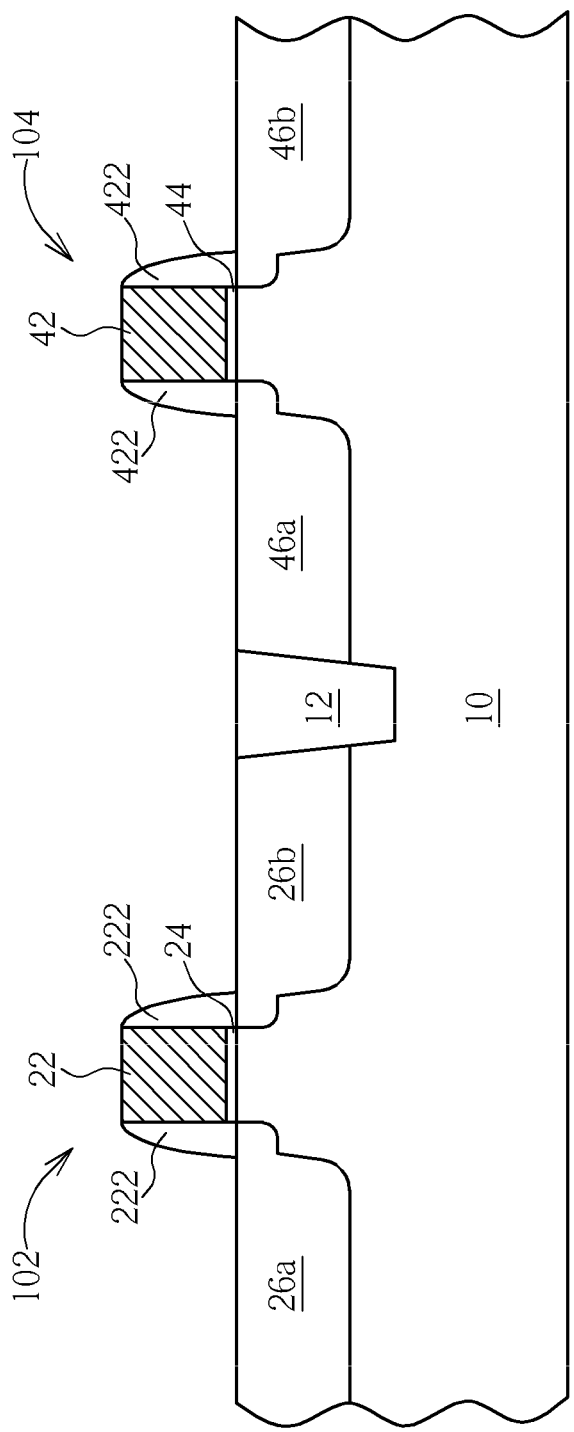
FIGS. 1-5 are schematic, cross-sectional diagrams illustrating a method for fabricating the improved semiconductor device structure with multi-layer contact etch stop layer (CESL) structure in accordance with one embodiment of this invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. However, it will be apparent to one skilled in the art that the invention may be practiced without these specific details. In order to avoid obscuring the present invention, some well-known system configurations and process steps are not disclosed in detail.

Likewise, the drawings showing embodiments of the apparatus are semi-diagrammatic and not to scale and, particularly, some of the dimensions are for the clarity of presentation and are shown exaggerated in the FIGS. Also, where multiple embodiments are disclosed and described having some features in common, for clarity and ease of illustration and description thereof like or similar features one to another will ordinarily be described with like reference numerals.

FIGS. 1-5 are schematic, cross-sectional diagrams illustrating a method for fabricating the improved semiconductor device structure with multi-layer contact etch stop layer (CESL) structure in accordance with one embodiment of this invention. As shown in FIG. 1, an N-type metal-oxide-semiconductor (NMOS) transistor device 102 and a P-type metal-oxide-semiconductor (PMOS) transistor device 104 are provided on a semiconductor substrate 10. It should be noted that MOS transistors in this embodiment are only illustrative; this invention also applies to other types of transistor. Besides, although there are two transistors shown in this embodiment, this invention applies to one or more transistors. Furthermore, this invention applies to P-type transistor, N-type transistor or both. The semiconductor substrate 10 may include but not limited to silicon substrate, silicon substrate with an epitaxial layer, a silicon-on-insulator substrate containing a buried insulator layer, gallium arsenide (GaAs) substrate, gallium arsenide-phosphide (GaAsP) substrate, indium phosphide (InP) substrate, gallium aluminum arsenic (GaAlAs) substrate, or indium gallium phosphide (InGaP) substrate.

According to one embodiment of this invention, the semiconductor substrate 10 may be a P type silicon substrate. A shallow trench isolation (STI) region 12 may be formed in the main surface of the semiconductor substrate 10 to isolate the NMOS transistor device 102 from the PMOS transistor device 104.

The NMOS transistor device 102 may comprise a gate electrode 22 overlying an active area of the semiconductor substrate 10, a gate dielectric layer 24 interposed between the gate electrode 22 and the semiconductor substrate 10, a heavily doped (N+) source region 26a in the semiconductor substrate 10 at one side of the gate electrode 22, and a heavily doped (N+) drain region 26b in the semiconductor substrate 10 at the other side of the gate electrode 22. A sidewall spacer 222 may be formed on the sidewalls of the gate electrode 22.

Likewise, the PMOS transistor device 104 may comprise a gate electrode 42 overlying an active area of the semiconductor substrate 10, a gate dielectric layer 44 interposed between the gate electrode 42 and the semiconductor substrate 10, a heavily doped (P+) source region 46a in the semiconductor substrate 10 at one side of the gate electrode 42, and a heavily doped (P+) drain region 46b in the semiconductor substrate 10 at the other side of the gate electrode 42. A sidewall spacer 422 may be formed on the sidewalls of the gate electrode 42. It should be noted that the structures of the NMOS transistor device 102 and the PMOS transistor device 104 in this embodiment are illustrative only. This invention is suitable for semiconductor devices, such as transistors, with any structures.

Figure 2:
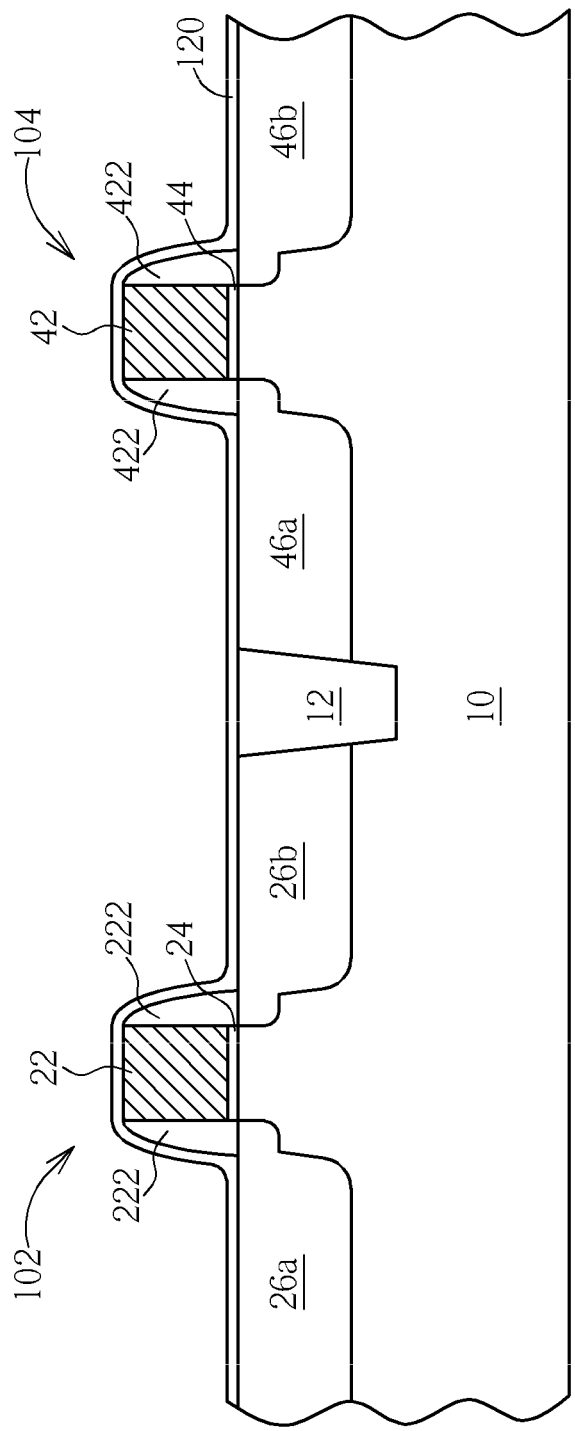

As shown in FIG. 2, a first CESL 120 can be conformally deposited onto the semiconductor substrate 10 in a blanket manner. The first CESL 120 may cover the NMOS transistor device 102, the STI region 12 and the PMOS transistor device 104. More specifically, the first CESL 120 may cover the heavily doped source region 26a, the spacer 222, the gate electrode 22, and the heavily doped drain region 26b of the NMOS transistor device 102, and may cover the heavily doped source region 46a, the spacer 422, the gate electrode 42, and the heavily doped drain region 46b of the PMOS transistor device 104. According to one embodiment of this invention, the first CESL 120 may include but not limited to silicon nitride, silicon oxide, silicon oxy-nitride or a combination thereof.

According to one preferred embodiment of this invention, the first CESL 120 may be a silicon nitride layer. Thickness of the first CESL 120 depends upon technology nodes. For example, the first CESL 120 may have a thickness ranging between tens to hundreds angstroms. The first CESL 120 may be a stress layer that imparts stress, for example, a tensile-stress layer or a compressive-stress layer. According to one embodiment of this invention, the first CESL 120 is capable of imparting strain to the underlying substrate or, most importantly, the channel of the underlying transistor device in order to improve the mobility of carriers. Various methods may be used to form the first CESL 120 over the substrate 10, for example, plasma-enhanced CVD (PECVD) or low-pressure CVD (LPCVD).

Figure 3:
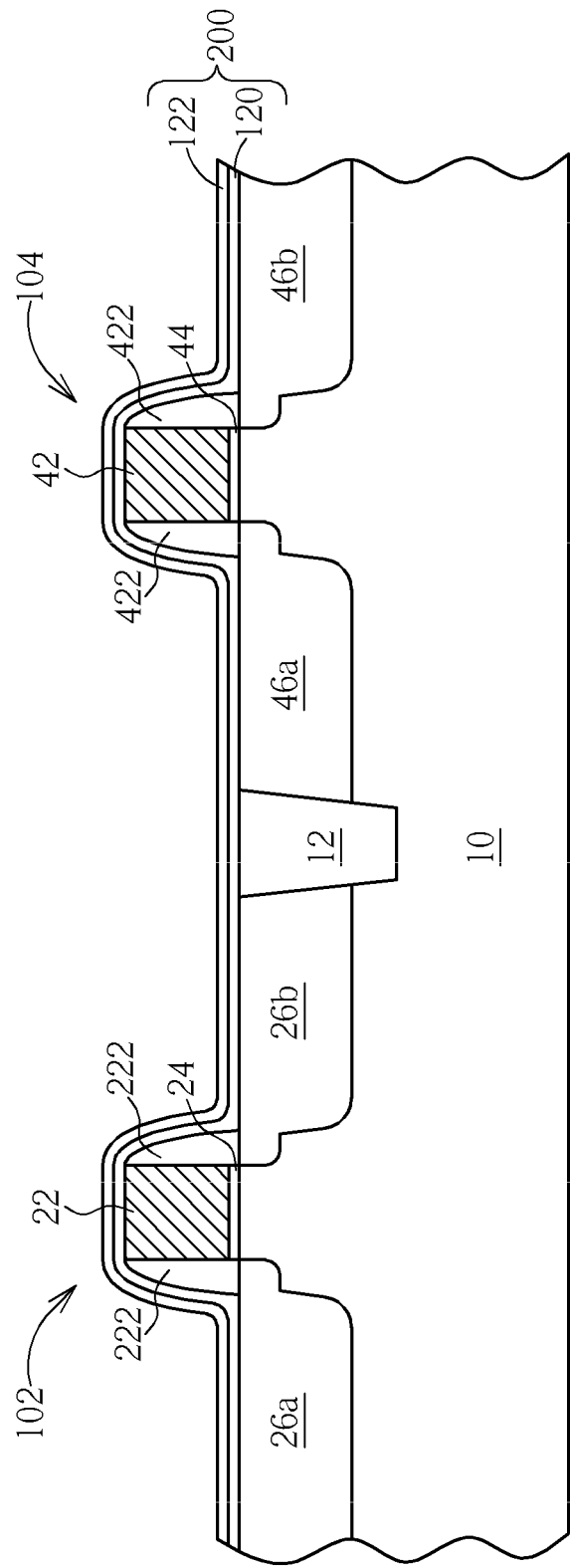

As shown in FIG. 3, after the forming, such as deposition, of the first CESL 120, a second CESL 122 can be formed, such as deposited, on the first CESL 120 in a blanket manner. Thickness of the second CESL 122 depends upon technology nodes. For example, the second CESL 122 may have a thickness ranging between tens to hundreds angstroms. The second CESL 122 can conformally cover the first CESL 120 to thereby constitute a multi-layer CESL structure 200. According to one embodiment of this invention, the second CESL 122 is made of a material different from that of the first CESL 120. For example, the first CESL 120 can be a silicon nitride layer and the second CESL 122 can be a silicon oxy-nitride layer.

According to one embodiment of this invention, the second CESL 122 may include but not limited to silicon nitride, silicon oxide, silicon oxy-nitride, silicon carbide or a combination thereof. According to one embodiment of this invention, the second CESL 122 can act as a plasma discharging layer that is capable of shunting plasma induced charge during a plasma process to prevent the underlying devices from being damaged by voltage stress, whereby the device reliability would not be degraded and threshold voltage (Vt) shift can be decreased.

To efficiently shunt the plasma induced charge, the second CESL 122 may have stronger plasma immunity than that possessed by the first CESL 120. It is understood that the second CESL 122 may also be a stress layer that imparts stress, for example, a tensile-stress layer or a compressive-stress layer, for device performance improvement.

Figure 4:
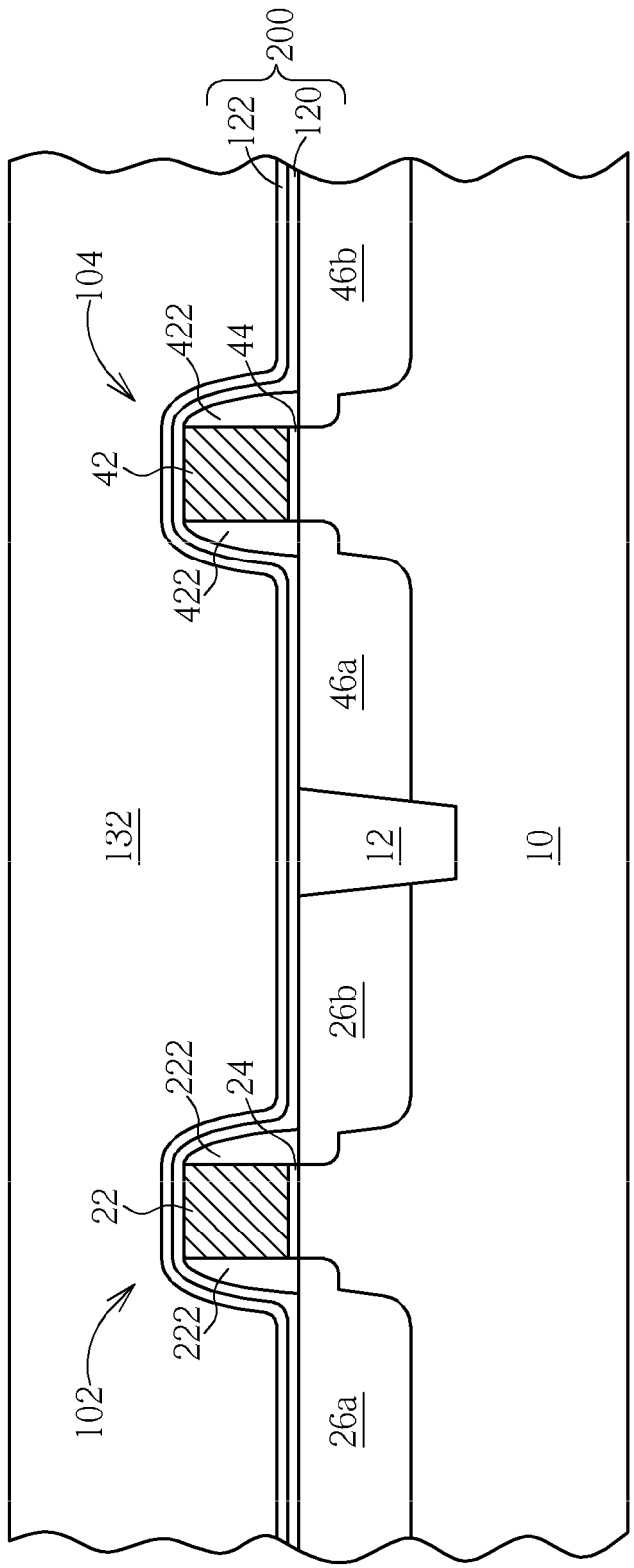

As shown in FIG. 4, subsequently, a dielectric layer, such as an inter-layer dielectric (ILD) layer 132 can be formed, such as deposited, in a blanket manner over the substrate 10. More specifically, the dielectric layer 132 may be disposed directly on the second CESL 122 over the both the NMOS transistor device 102 and the PMOS transistor device 104. The dielectric layer may include but not limited to silicon oxide such as undoped silica glass (USG), borosilicate glass (BSG), borophosphosilicate (BPSG) or a combination thereof. Various dielectric materials may be used to form the dielectric layer 132 which may be one or more than one layer. According to one embodiment of this invention, the second CESL 122 is made of a material different from that of the dielectric layer 132. The dielectric layer 132 may be formed by conventional methods, for example, PECVD or LPCVD.

Figure 5:
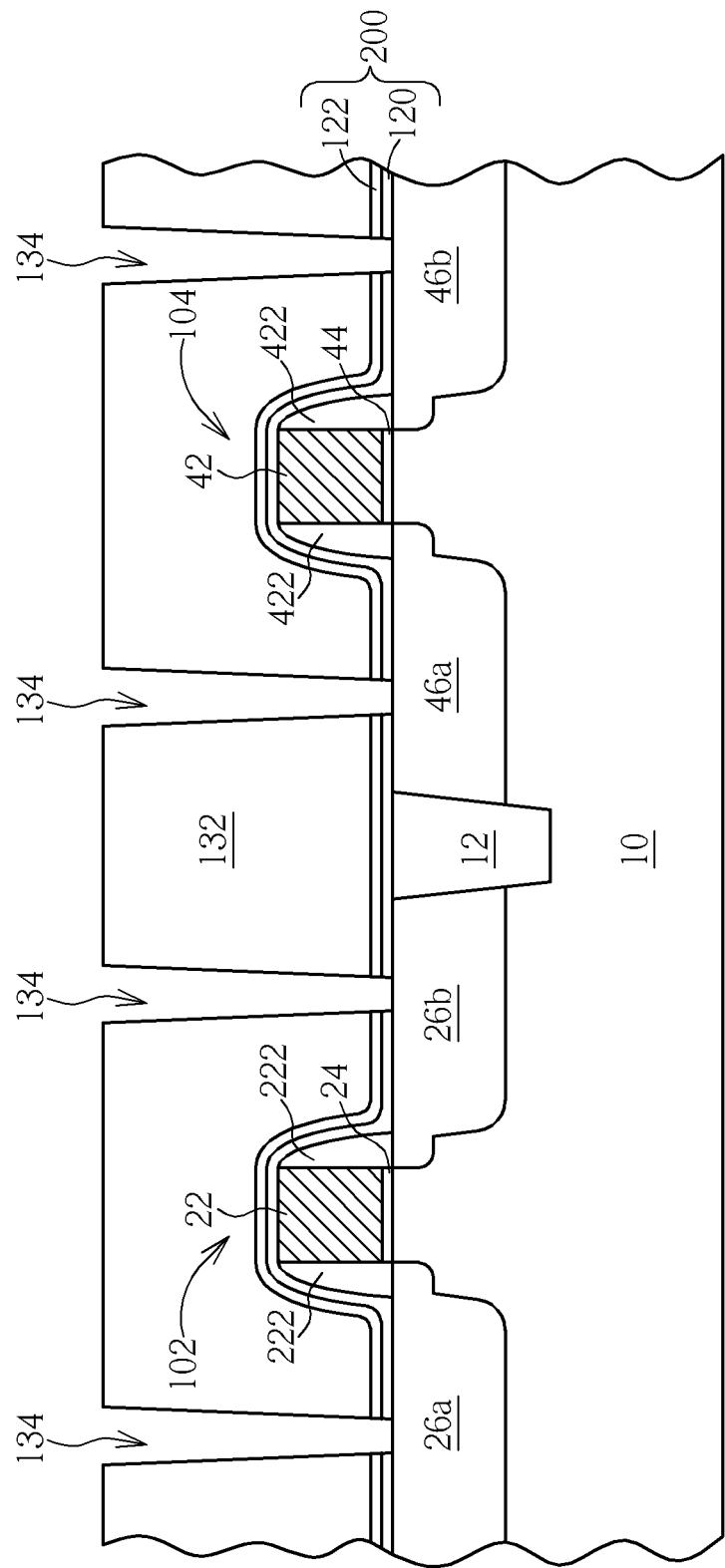

As shown in FIG. 5, subsequently, conventional lithographic and etching processes can be carried out to form contact holes 134 in the dielectric layer 132 and in the multi-layer CESL structure 200. For example, the etching process may be split into two steps. In the first etching step, an upper portion of the contact hole is etched into the dielectric layer 132 and stops on the top surface of the multi-layer CESL structure 200 or on the second CESL 122. The first etching step may have an aggressive dry etching condition and has a higher etching rate. In the second etching step, a mild etching condition and lower etching rate may be employed to etch through the remaining multi-layer CESL structure 200 to thereby expose a portion of the underlying diffusion region, i.e., source or drain region.

In other embodiments, the multi-layer CESL structure may include more than two CESLs. The CESLs can be made of at least two different materials, namely at least one CESL of the multi-layer CESL structure is made of a material different from that of another CESL of the multi-layer CESL structure. Besides, the top one of the CESLs of the multi-layer CESL structure is made of a material different from that of the dielectric layer on it.

Those skilled in the art will readily observe that numerous modifications and alterations of the device and method may be made while retaining the teachings of the invention.

What is claimed is:

1. A semiconductor device structure, comprising:
   a substrate comprising a transistor thereon;
   a bi-layer contact etching stop layer (CESL) structure covering the transistor, the bi-layer CESL structure comprising a first CESL and a second CESL on the first CESL, wherein the second CESL is in direct contact with the first CESL, the first CESL is in direct contact with the substrate and the transistor, and wherein the second CESL acts as a plasma discharging layer; and a dielectric layer on the second CESL, wherein the dielectric layer is in direct contact with the second CESL;

wherein the first CESL is made of a material different from that of the second CESL, and the second CESL is made of a material different from that of the dielectric layer, and wherein the second CESL has stronger plasma immunity than that of the first CESL.

2. The semiconductor device structure according to claim 1 wherein the first CESL comprises silicon nitride, silicon oxide, silicon oxy-nitride or a combination thereof.

3. The semiconductor device structure according to claim 1 wherein the second CESL comprises silicon nitride, silicon oxide, silicon oxy-nitride, silicon carbide or a combination thereof.

4. The semiconductor device structure according to claim 1 wherein the first CESL is made of silicon nitride and the second CESL is made of silicon oxy-nitride.

5. The semiconductor device structure according to claim 1 wherein the dielectric layer comprises undoped silica glass (USG), borosilicate glass (BSG), borophosphosilicate (BPSG) or a combination thereof.

6. The semiconductor device structure according to claim 1 wherein the first CESL is a stress layer.

7. The semiconductor device structure according to claim 6 wherein the first CESL is a tensile-stress layer.

8. The semiconductor device structure according to claim 1 wherein the second CESL is a stress layer.

9. A semiconductor device structure, comprising:
a substrate comprising an N-type metal-oxide-semiconductor (NMOS) transistor and a P-type metal-oxide-semiconductor (PMOS) transistor thereon;
a bi-layer contact etching stop layer (CESL) structure covering both of the NMOS transistor and the PMOS transistor, the bi-layer CESL structure comprising a first CESL and a second CESL on the first CESL, wherein the second CESL is in direct contact with the first CESL, the first CESL is in direct contact with the substrate, the NMOS transistor and the PMOS transistor, and wherein the second CESL acts as a plasma discharging layer; and
a dielectric layer on the second CESL, wherein the dielectric layer is in direct contact with the second CESL;
wherein the first CESL is made of a material different from that of the second CESL, and the second CESL is made of a material different from that of the dielectric layer, and wherein the second CESL has stronger plasma immunity than that of the first CESL.

10. The semiconductor device structure according to claim 9 wherein the first CESL comprises silicon nitride, silicon oxide, silicon oxy-nitride or a combination thereof.

11. The semiconductor device structure according to claim 9 wherein the second CESL comprises silicon nitride, silicon oxide, silicon oxy-nitride, silicon carbide or a combination thereof.

12. The semiconductor device structure according to claim 9 wherein the first CESL is made of silicon nitride and the second CESL is made of silicon oxy-nitride.

13. The semiconductor device structure according to claim 9 wherein the dielectric layer comprises undoped silica glass (USG), borosilicate glass (BSG), borophosphosilicate (BPSG) or a combination thereof.

14. The semiconductor device structure according to claim 9 wherein the first CESL is a stress layer.

15. The semiconductor device structure according to claim 9 wherein the second CESL is a stress layer.

16. The semiconductor device structure according to claim 9 wherein the dielectric layer is disposed directly on the second CESL over both the NMOS transistor and the PMOS transistor.

17. The semiconductor device structure according to claim 14 wherein the first CESL is a tensile-stress layer.

18. The semiconductor device structure according to claim 14 wherein the first CESL is a compressive-stress layer.

* * * * *